(12) United States Patent
Heiden

(10) Patent No.: US 7,986,409 B2
(45) Date of Patent: Jul. 26, 2011

(54) METHOD FOR DETERMINING THE CENTRALITY OF MASKS

(75) Inventor: Michael Heiden, Woelfersheim (DE)

(73) Assignee: Vistec Semiconductor Systems GmbH, Weilburg (DE)

(*) Notice: Subject to any disclaimer, the term of this patent is extended or adjusted under 35 U.S.C. 154(b) by 415 days.

(21) Appl. No.: 12/286,026

(22) Filed: Sep. 26, 2008

(65) Prior Publication Data

US 2009/0097041 A1    Apr. 16, 2009

(30) Foreign Application Priority Data

Oct. 11, 2007  (DE) .................. 10 2007 049 100

(51) Int. Cl.
*G01B 11/00*  (2006.01)
*G01B 11/14*  (2006.01)
*G06K 9/00*  (2006.01)

(52) U.S. Cl. ........ 356/399; 356/401; 356/614; 356/620; 382/151

(58) Field of Classification Search .................. None
See application file for complete search history.

(56) References Cited

U.S. PATENT DOCUMENTS

| | | | | |
|---|---|---|---|---|
| 4,388,386 | A | 6/1983 | King et al. ................ 430/5 |
| 4,586,822 | A | 5/1986 | Tanimoto ................ 356/394 |
| 5,250,983 | A * | 10/1993 | Yamamura ............... 355/125 |
| 5,464,715 | A * | 11/1995 | Nishi et al. ............... 430/22 |
| 6,226,087 | B1 | 5/2001 | Blaesing-Bangert ...... 356/401 |
| 6,549,648 | B1 | 4/2003 | Rinn ...................... 382/151 |
| 7,239,376 | B2 * | 7/2007 | Hibbs et al. ............... 355/75 |
| 7,528,960 | B2 * | 5/2009 | Boesser et al. ............ 356/500 |
| 7,584,072 | B2 * | 9/2009 | Fricke et al. .............. 702/150 |
| 7,654,007 | B2 * | 2/2010 | Heiden et al. ............. 33/502 |
| 7,675,633 | B2 * | 3/2010 | Schmidt ................... 356/620 |
| 7,903,259 | B2 * | 3/2011 | Heiden .................... 356/500 |
| 2006/0103838 | A1 | 5/2006 | Richter et al. ............. 356/237.5 |

FOREIGN PATENT DOCUMENTS

| | | |
|---|---|---|
| DE | 198 17 714 | 10/1999 |
| DE | 198 25 829 | 12/1999 |
| DE | 10 2004 055 250 | 5/2006 |
| EP | 0 105 611 | 4/1984 |

OTHER PUBLICATIONS

Carola Blaesing:"Pattern Placement Metrology for Mask Making," presented by Dr. Carola Bläsing at the Semicon meeting, Education Program in Geneva, Switzerland on Mar. 31, 1998, 11 pages.

* cited by examiner

*Primary Examiner* — Tari Chowdhury
*Assistant Examiner* — Gordon J Stock, Jr.
(74) *Attorney, Agent, or Firm* — Davidson Davidson & Kappel, LLC

(57) ABSTRACT

A method for determining the centrality of masks is disclosed. The mask is positioned in a coordinate measuring device on a measurement table displaceable in a direction perpendicular to the optical axis of an imaging measurement system in an interferometrically measurable way. The position of a mask coordinate system with respect to the measuring device coordinate system is determined based on at lest two structures on the mask. The relative distance from one of the at least first and second outer edges to the at least two structures is determined. The coordinate measuring machine determines the actual coordinates of the at least two structures with respect to the respective outer edges, which must not exceed a predetermined deviation from a desired value.

14 Claims, 7 Drawing Sheets

METHOD FOR DETERMINING THE CENTRALITY OF MASKS

This claims the benefit of German Patent Application No. 10 2007 049 100.1, filed Oct. 11, 2007 and hereby incorporated by reference herein.

The present invention relates to a method for determining the centrality of masks. For the inventive method, the mask is positioned in a coordinate measuring device on a measurement table displaceable in a direction perpendicular to the optical axis of an imaging measurement system in an interferometrically measurable way. The coordinate measuring device determines a measuring device coordinate system.

BACKGROUND

German Patent DE 198 17 714 discloses a method for measuring the position of structures on a mask surface, wherein the mask is positioned in an image-evaluating coordinate measuring device on a measurement table displaceable in a direction perpendicular to the optical axis of an imaging measurement system in an interferometrically measurable way. A mask coordinate system associated with the mask is aligned relative to a measuring device coordinate system with the help of alignment marks. The desired position of the structures is given in the mask coordinate system. A coordinate position of two outer edges of the mask, which are perpendicular to each other, is measured in the mask coordinate system. For this purpose, the distances from two structures to an outer edge and from one structure to the other outer edge are determined.

German published patent application DE 198 25 829 discloses a method for determining the position P of a structural element non-orthogonal to the coordinate axes (x, y) of a substrate. The structural element is imaged onto a detector array of a CCD camera including a reference point. With the help of a measurement window rotated at an angle Θ with respect to the coordinate system, the position of an edge of the structural element relative to the reference point is determined. The position L of the reference point relative to the origin of the coordinate system is determined based on the angle Θ and the current measurement table coordinates, so that the position P is obtained. Determination of centrality is not included.

A measuring device for performing such a method is described with its basic elements in the lecture script "Pattern Placement Metrology for Mask Making," Dr. C. Bläsing, Semicon Geneva, Education Program, issued on Mar. 31, 1998. The measuring device particularly serves for controlling the quality of masks for the semiconductor production. The quality of the mask is gaining more and more importance in type production. The specifications for the positions of the structures (pattern) from one mask to the other are becoming tighter and tighter. The measuring device described in the lecture script may measure the position of the structures relative to defined alignment marks, which define the mask coordinate system, with an accuracy of typically less than 10 nm. With the help of these alignment marks, the masks may be aligned in the stepper for the projection on wafer surfaces. Errors made in this process are directly added to the error budget of the lithography process. The mask is aligned in the stepper such that the respective alignment marks are positioned exactly one on top of the other during exposure. However, the steppers only have a certain area in which the mask may be shifted and/or rotated for physical alignment. The centrality of the masks is defined by the position of the pattern on the mask and thus determines the central position of the pattern (for the exposure of the wafer) within the mask.

German published patent application DE 10 2004 055 250 A1 discloses the inspection of a wafer, wherein a wafer-to-wafer comparison is restricted to predetermined compared regions selectable by the user. Only areas of a wafer are compared. This does not include the determination of coordinates and/or relative positions within predetermined coordinate systems.

European Patent EP 0 105 611 B1 discloses a device for inspecting structures applied to a mask for the semiconductor production. The patent is directed at the measurement of the structures on the mask rather than at the actual alignment.

U.S. Pat. No. 4,586,822 discloses a method for inspecting a mask for the production of a semiconductor device. The alignment marks on the mask are used to align the mask and the wafer such that structures may be exposed in an exact position with respect to each other. The result of the exposure on the wafer is also inspected to find defects and/or foreign particles on the mask. This method is not beneficial to achieving a high throughput in mask measuring.

U.S. Pat. No. 4,388,386 discloses a method with which insufficient matching of a mask set may be reduced to a minimum. Each mask of the set is compared to a known standard. Again, determination of centrality is not included. The position of structures with respect to the edges of the mask is not determined.

As specifications for all components become tighter and tighter, the position of the structures relative to the outer edge of the mask has turned into an important quality criterion of the mask. The exact rectangularity of the mask is no longer a negligible quality criterion either. Previously, the outer edges of the masks were assumed to meet at a right angle. As the accuracy of the coordinate measuring machine increases, the exact rectangularity and/or deviations from rectangularity where the outer edges meet also have come to play an important role.

The rectangularity of the outer edges and/or the knowledge about deviations of the outer edges from rectangularity play an important role because, in the lithography device (such as e-beam or laser lithography), the mask is normally contacted in three places to obtain a reproduced position. The three points define the two outer edges of the mask. The outer edges of the masks are assumed to be at a right angle with respect to each other. If this is not the case or if the non-rectangularity of the outer edges influences the result of the lithography, it is necessary to know about the rectangularity or non-rectangularity of the outer edges. Only in this way these edges may be used as reference for the pattern generated on the mask by the structures.

However, each new chip generation has increased requirements regarding accuracy and measurement throughput. The accuracy achievable by manual measurement using a conventional microscope is no longer sufficient. In addition, the manual measurement requires a lot of time for the alignment in the measuring device, the locating of the structures and the actual measuring. Therefore it is particularly important that measuring the structures on the surface of a mask and determining the rectangularity of the outer edges with respect to each other may be performed in one measuring device. If this is the case, the mask does no longer have to be transported from one measuring device to the other, which ultimately represents an error source for damage to the mask. Furthermore, the time required for temperature adaptation of the mask may be avoided if the measurement takes place in a single device.

SUMMARY OF THE INVENTION

It is an object of the invention to provide a measuring method with which properties of a mask may be determined with increased accuracy. The risk of damage should be avoided, and the throughput of masks to be measured should be maintained at a high level.

The present invention provides a method including the steps of: positioning the mask in a coordinate measuring device on a measurement table displaceable in a direction perpendicular to an optical axis of an imaging measurement system, wherein the position of the measurement table is measured interferometrically; a measuring device coordinate system being defined by the coordinate measuring device; determining the position of at least a first and a second outer edge of the mask in the measuring device coordinate system; determining an angle at which the first and second outer edge meet from the position of the first and second outer edge in the coordinate system of the measuring device; determining the position of a mask coordinate system with respect to the measuring device coordinate system based on at least two structures on the mask; determining the relative distance from one of the at least first and second outer edges to the at least two structures, and determining by the coordinate measuring machine the coordinates of the at least two structures with respect to the first and second edge, which must not exceed a predetermined deviation from a desired value.

It is advantageous if the position of at least a first and a second outer edge of the mask is determined in the measuring device coordinate system, wherein the outer edges abut. The position of the mask coordinate system, in which the positions of the structures on the mask are defined, is determined by means of at least two alignment marks in the measuring device coordinate system. The position of the mask coordinate system may also be determined with the help of any at least two structures on the mask. The use of alignment marks is not to be considered as limiting the invention in any way. If the relative positions of the mask coordinate system and the measuring device coordinate system with respect to each other are known, the position of a structure in the mask coordinate system may be converted for the measuring device coordinate system, for example. The position of the structure is known from the design data of the mask. Similarly, the positions of the outer edges determined in the measuring device coordinate system may be converted for the mask coordinate system. Since the coordinate systems may unambiguously be converted into each other, the further discussion may be limited to the mask coordinate system. As for any other structure, the position of the edge in the mask coordinate system must be correct. In addition, the direction must also be correct.

An angle at which the two outer edges meet is determined from the position of the outer edges in the measuring device coordinate system. The position of each of the abutting outer edges is determined by means of at least one measurement window of a camera arranged in the imaging measurement system and by subsequent image processing. The at least one measurement window is positioned such that the respective outer edge of the mask is located in the measurement window.

The position of the mask coordinate system relative to the measuring device coordinate system can be determined based on the positions of two structures. The position of the two outer edges can be determined based on the positions of two structures. The structures are not located on any line parallel to one of the two outer edges. The distance from the structures to the abutting outer edges is determined in the X-coordinate direction and in the Y-coordinate direction. The relative distance from one of the outer edges to reference structures may be determined. Then the coordinate measuring machine determines the actual coordinates of the reference patterns and the respective outer edge. This yields the distance from the respective reference patterns to the respective outer edge. The distance must not exceed a predetermined deviation from a desired value. The distribution of the reference points on the mask may be arbitrary.

The relative distance of the outer edges and/or the position of the outer edges in the measuring device coordinate system can be determined based on the positions of three structures (or reference structures), wherein the structures must not be located on any line parallel to one of the two outer edges. The distance from the structures to the abutting outer edges is determined in the X-coordinate direction and in the Y-coordinate direction.

The relative distance of the outer edges and/or the position of the outer edges in the measuring device coordinate system can be determined based on the positions of four structures, wherein always two of the structures are located on different lines. The distance from the structures to the abutting outer edges is determined in the X-coordinate direction and in the Y-coordinate direction.

The position of each pair of structures is determined by image evaluation of the data of the structures acquired with the at least one measurement window.

A reference image of the outer edge can be stored in the coordinate measuring device, and a position of the outer edge to be measured can be determined such that the stored reference image of the outer edge is matched with the image of the outer edge acquired with the measurement window of the camera by rotating and/or shifting. The position of the outer edge results from the amount of rotating and/or shifting of the reference image with respect to the mask coordinate system. The measurement of the position of the outer edge is performed with imaging optics having a low aperture. At least in the area below the outer edges of the mask positioned thereon, a surface of the measurement table is provided with a reflective agent designed to reflect the imaging beams of the measuring device. An angle at which the abutting outer edges intersect may be determined based on the position of the abutting outer edges.

Various evaluations, such as center of gravity shifts, rotations or the orthogonality of the structural pattern relative to the mask coordinate system, may be determined from the stored coordinate positions of the structures on the mask, the positions of the outer edges and the angular position of the intersecting outer edges. The inventive method also allows determining the deviation of a mask from rectangularity.

BRIEF DESCRIPTION OF THE DRAWINGS

In the following, embodiments will explain the invention and its advantages in more detail with reference to the accompanying drawings, in which.

DETAILED DESCRIPTION

Figure 1:
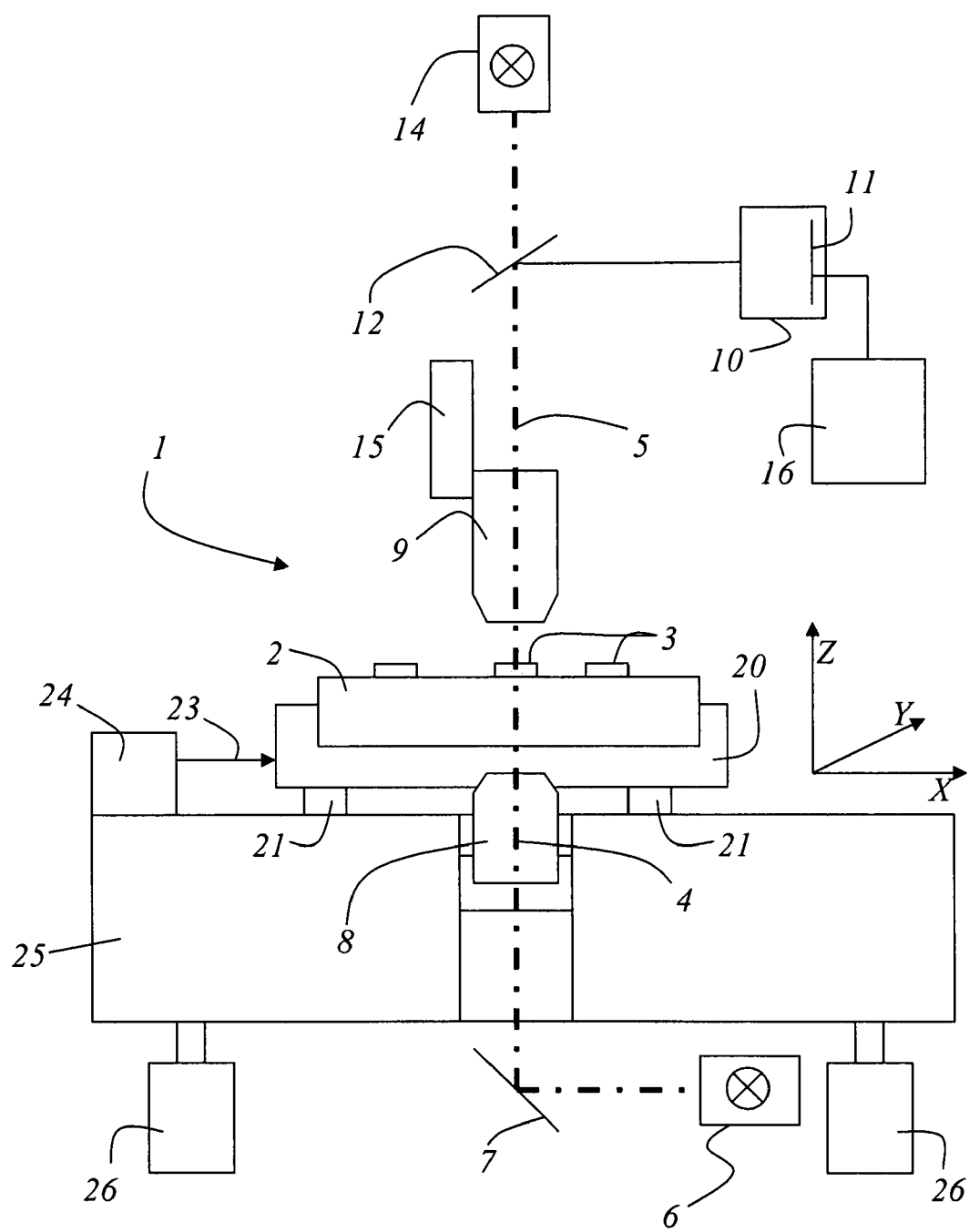
FIG. 1 schematically shows a coordinate measuring device with which the inventive method may be performed.

A coordinate measuring device with which the inventive method is performed is shown in FIG. 1 and has already been described in detail with respect to the prior art. The coordinate measuring device 1 includes a measurement table 20 movable in the X-coordinate direction and in the Y-coordinate direction. The measurement table 20 carries a substrate or a mask 2 for the semiconductor production. Several structures 3 are applied to a surface of the mask 2. The measurement table itself is supported by air bearings 21 which, in turn, are supported by a granite block 25. The use of a granite block 25 does not limit the invention in any way. It is obvious for someone skilled in the art that other materials may also be used if they have a corresponding plane in which the measurement table 20 may be moved. At least one incident light illumination means or device 14 and/or one transmitted light illumination means or device 6 are provided for the illumination of the mask 2. In the embodiment shown, the light of the transmitted light illumination means 6 is launched into the illumination axis 4 for the transmitted light by means of a deflecting mirror 7. The light of the illumination means 6 reaches the mask 2 via a condenser 8. The light of the incident light illumination means 14 reaches the mask 2 through the measurement objective. The light coming from the mask 2 is collected by the measurement objective 9 and coupled out of the optical axis 5 by a semitransparent mirror 12. This measurement light reaches a camera 10 provided with a detector. The detector 11 has a computing unit 16 associated therewith, with which digital images may be generated from the acquired data.

The position of the measurement table 20 is measured and determined by means of at least one laser interferometer 24. For this purpose, the laser interferometer 24 emits a measurement light beam 23. Also, the measurement microscope 9 is connected to a displacing means 15 in the Z-coordinate direction so that the measurement objective may be focused on the surface of the mask. The position of the measurement objective 9 may, for example, be measured with a glass scale (not shown). The granite block 25 is further positioned on legs with an anti-vibration arrangement 26. This vibration damping is supposed to maximally reduce or eliminate all potential building vibrations and natural vibrations of the coordinate measuring device.

Figure 2:
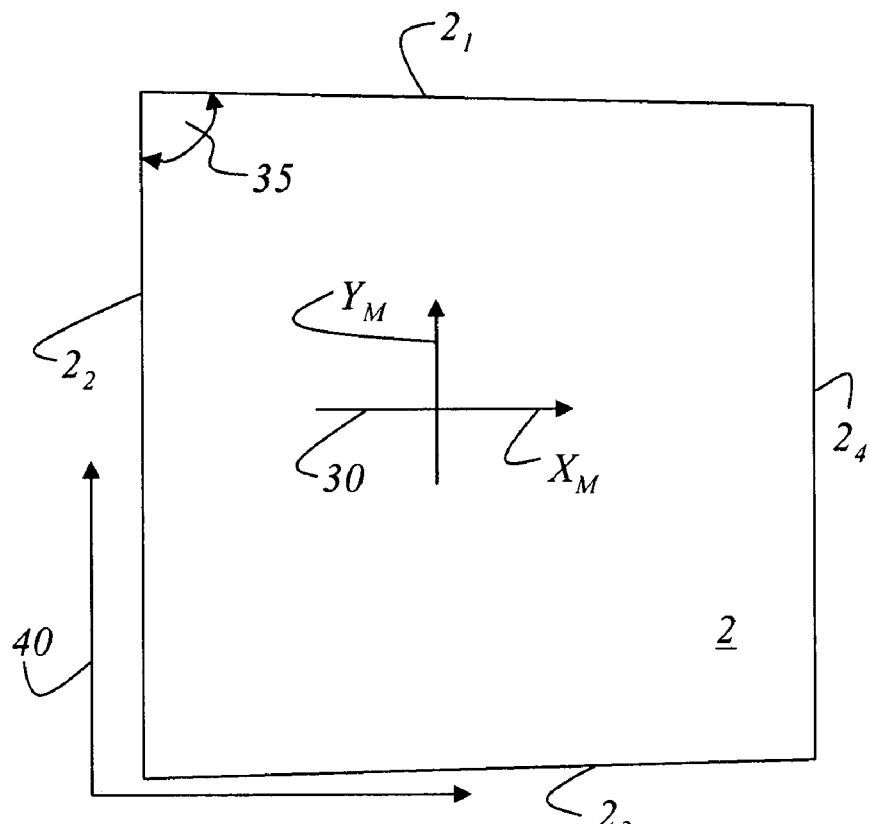
FIG. 2 schematically shows a top view of a mask.

FIG. 2 shows a schematic view of a mask 2. The outline of the mask 2 is defined by four outer edges $2_1$, $2_2$, $2_3$ and $2_4$. The mask 2 defines a mask coordinate system 30. As mentioned above, the mask is inserted in a coordinate measuring device 1. This coordinate measuring device 1 defines a measuring device coordinate system 40. FIG. 2 also shows that the first outer edge $2_1$ and the second outer edge $2_2$ meet at an angle 35. In the embodiment shown in FIG. 2, the angle 35 is not a right angle. Previously, it was generally assumed that the outer edges of the mask 2 meet at a right angle. This assumption may no longer be maintained with increasing accuracy of the measurement or if higher accuracy is required for the measurement.

Figure 3:
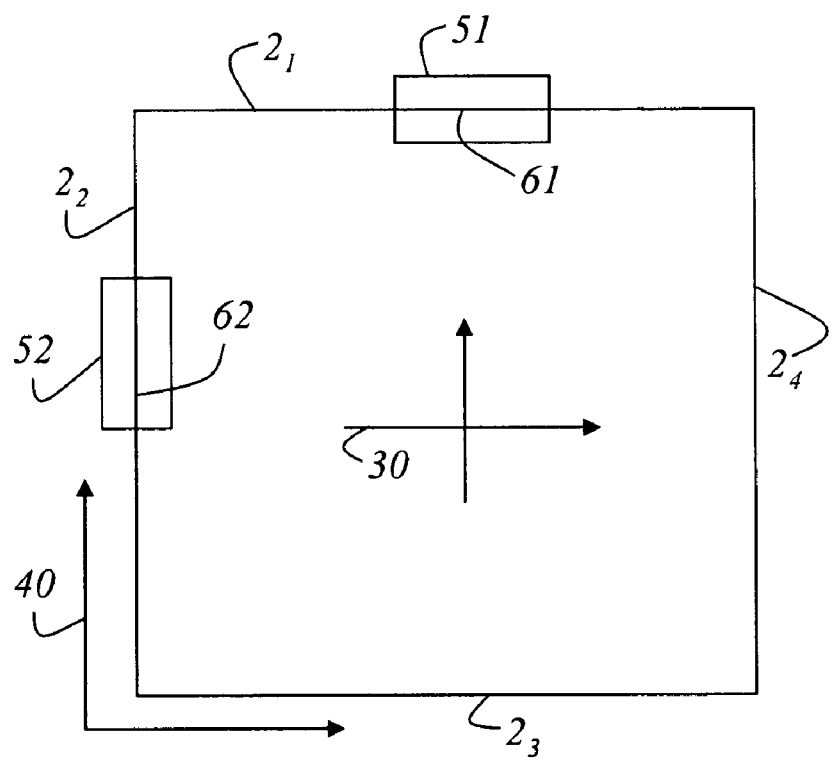
FIG. 3 schematically shows a first embodiment of the method, wherein the position of the outer edges is determined with two different measurement windows.
Figure 4:
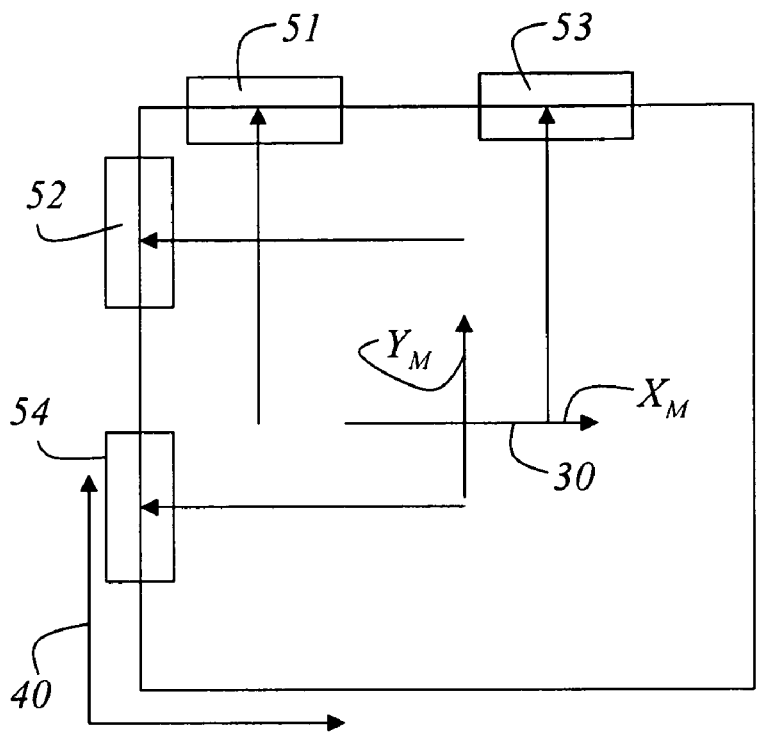
FIG. 4 shows a schematic representation of the further method wherein the position of two adjacent outer edges with respect to each other is determined with four different windows.

FIG. 3 shows a schematic view of a mask, wherein the first outer edge $2_1$ and the second outer edge $2_2$ are determined with a first measurement window 51 and a second measurement window 52. With the help of the first measurement window 51 and the second measurement window 52, the position of the outer edge and/or the course of the outer edge is determined. With the help of the first measurement window 51 and the second measurement window 52, a two-dimensional image of an area around the outer edges $2_1$ and $2_2$, respectively, is acquired. By means of image processing, the course of part 61 of the first outer edge $2_1$ is determined in the first measurement window 51, and the course of part 62 of the second outer edge $2_2$ is determined in the second measurement window. When the course of the corresponding outer edges $2_1$ and $2_2$ has been determined, these outer edges may be extrapolated so that an area where the outer edges meet is obtained. The angle at which these outer edges meet is also calculated therefrom. Someone skilled in the art will understand that the measurement window 51 may encompass the entire area of the image section of the image sensor. The size of the measurement window may be adapted to the measuring task by the user.

Figure 5:
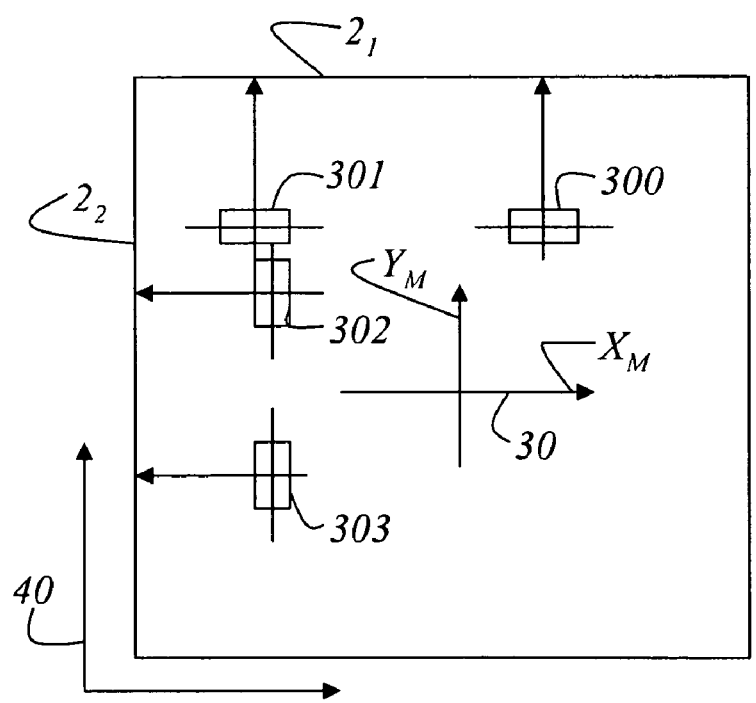
FIG. 5 shows a further embodiment of the method, wherein the position of the outer edges is determined with four different structures.

FIG. 5 shows an embodiment, wherein the position of the first outer edge $2_1$ of the mask 2 is determined with two different structures 300 and 301. The position of the second outer edge $2_2$ of the mask 2 is also determined with two other structures 302 and 303. Information on the position of the outer edges $2_1$ and $2_2$, respectively, is obtained based on the distance from the structures to the respective outer edge. The angle at which the two outer edges $2_1$ and $2_2$ meet may again be determined therefrom.

FIG. 5 shows an embodiment, wherein the position of the first outer edge $2_1$ of the mask 2 is determined with two different structures 70 and 71. The position of the second outer edge $2_2$ of the mask 2 is also determined with two other structures 72 and 73. Information on the position of the outer edges $2_1$ and $2_2$, respectively, is obtained based on the distance from the structures to the respective outer edge. The angle at which the two outer edges $2_1$ and $2_2$ meet may again be determined therefrom.

Figure 6:
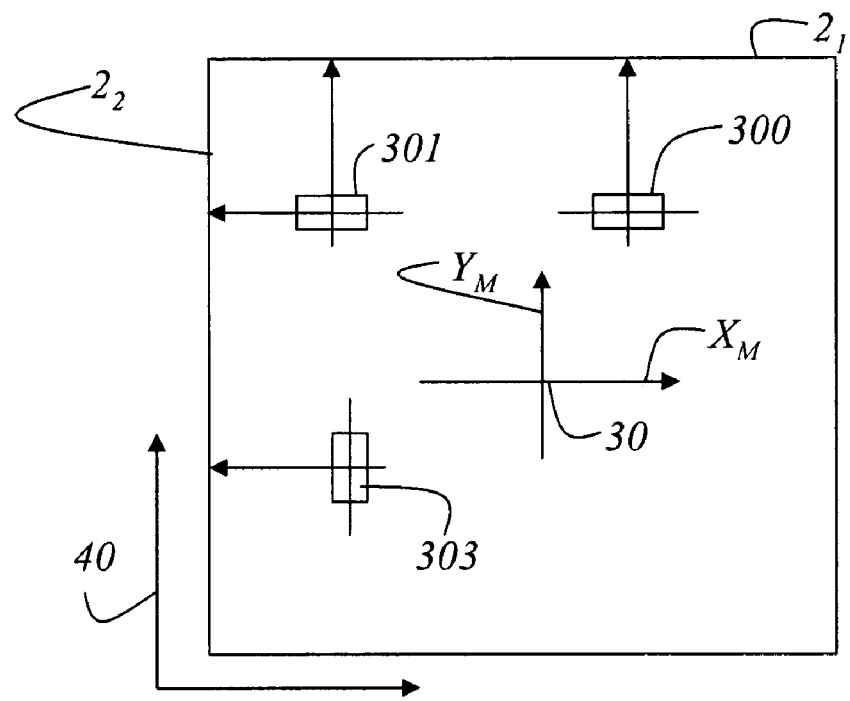
FIG. 6 shows an embodiment of the method, wherein the position of the outer edges of the mask with respect to each other is determined based on three different structures.

FIG. 6 shows a further embodiment for determining the position of the first outer edge $2_1$ and the second outer edge $2_2$. In order to determine these outer edges $2_1$ and $2_2$, two structures 300, 301 are used to determine the position of the first outer edge $2_1$ with respect to the X-coordinate axis $X_M$ of the mask coordinate system 30. One of the structures for determining the position of the first outer edge $2_1$ is also used for determining the position of the second outer edge $2_2$. In order to determine the position of the second outer edge $2_2$, a further structure 303 is used, which was not used for determining the position of the first outer edge $2_1$.

Figure 7:
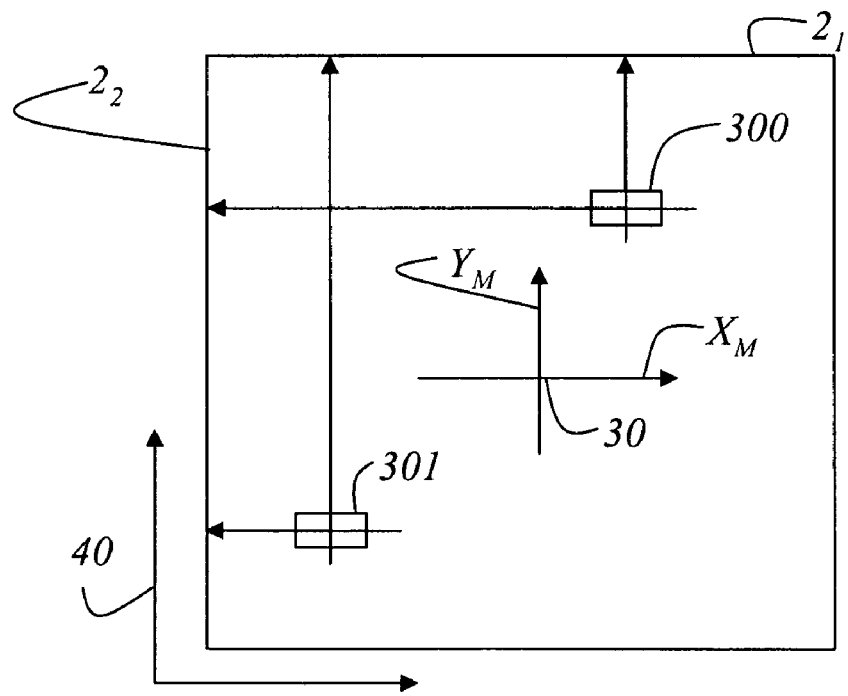
FIG. 7 shows an embodiment of the method, wherein the position of the outer edges of the mask with respect to each other is determined based on two different structures.

FIG. 7 shows a further embodiment for determining the position of the first outer edge $2_1$ and the second outer edge $2_2$. In order to determine these outer edges $2_1$ and $2_2$, two structures 300, 301 are used to determine the position of the first outer edge $2_1$ with respect to the X-coordinate axis $X_M$ of the mask coordinate system 30. The two structures 300, 301 are not located on any line parallel to the first outer edge $2_1$ and/or the second outer edge $2_2$.

Figure 8:
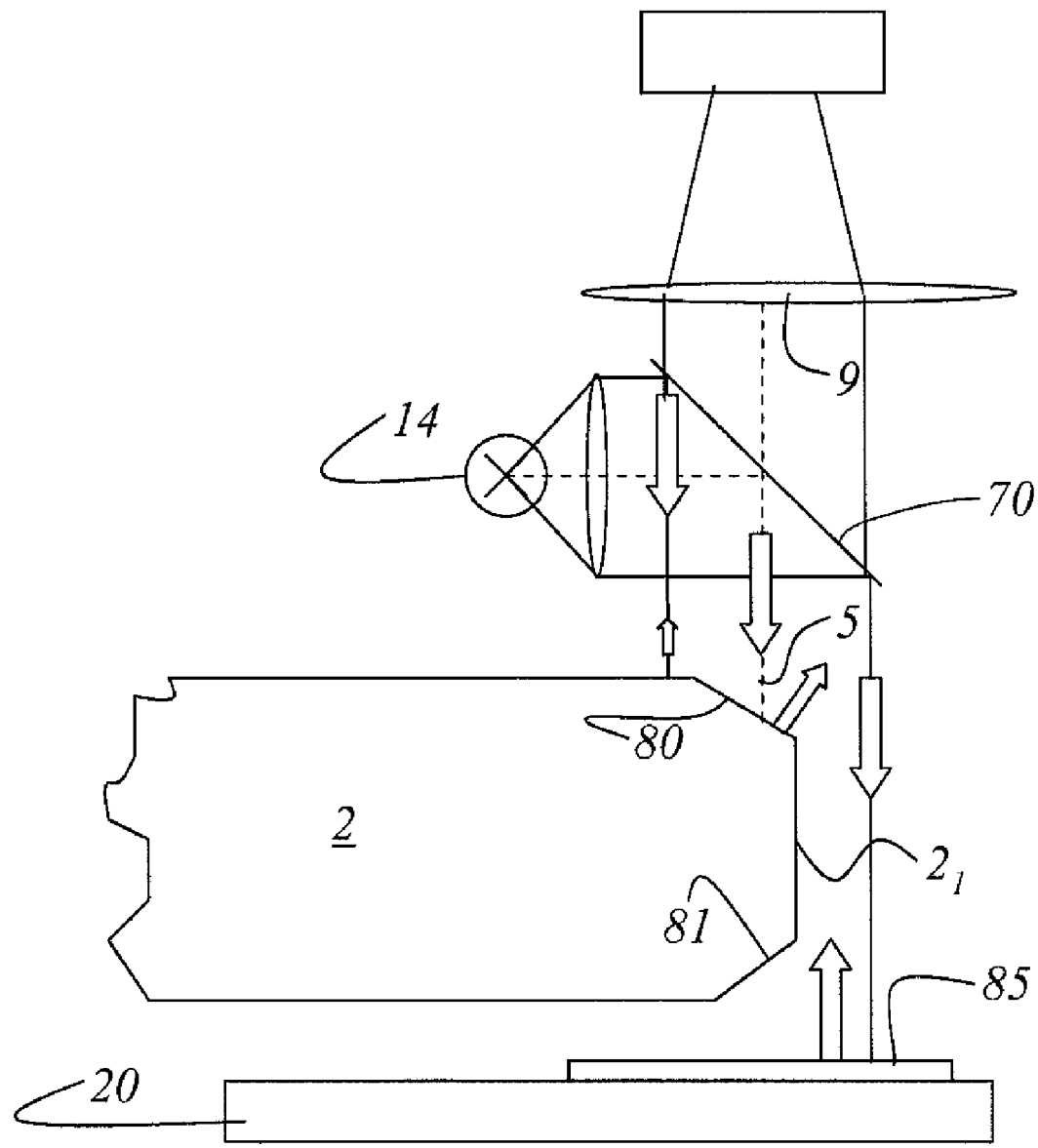
FIG. 8 shows a schematic representation of the illumination of the outer edge of a mask.

FIG. 8 shows a schematic embodiment for acquiring an image of the mask in the area of the outer edge $2_1$. For this purpose, the mask 2 is illuminated with the incident light illumination means 14. The parallelized light reaches the area of the outer edge $2_1$ of the mask 2 via a deflecting mirror 70. The mask 2 includes an upper chamfer 80 and a lower chamfer 81 in the area of the outer edge $2_1$. The light arriving from the illumination means 14 is reflected out of the optical illumination path 5 by the upper chamfer 80 so that the measurement objective 9 reflects less light in this area of chamfer 80. A reflective unit 85 is provided below the mask, which reflects the light completely so that a lot of light reaches the measurement objective 9 from this area. The incident amounts of light are indicated by corresponding arrows in FIG. 8, wherein the reflective unit 85 is fully reflective. The incident portions of the light and the portions returning from the reflective unit are represented by arrows of equal size. Correspondingly different representations show the portion of the light coming from the mask 2.

Figure 9:
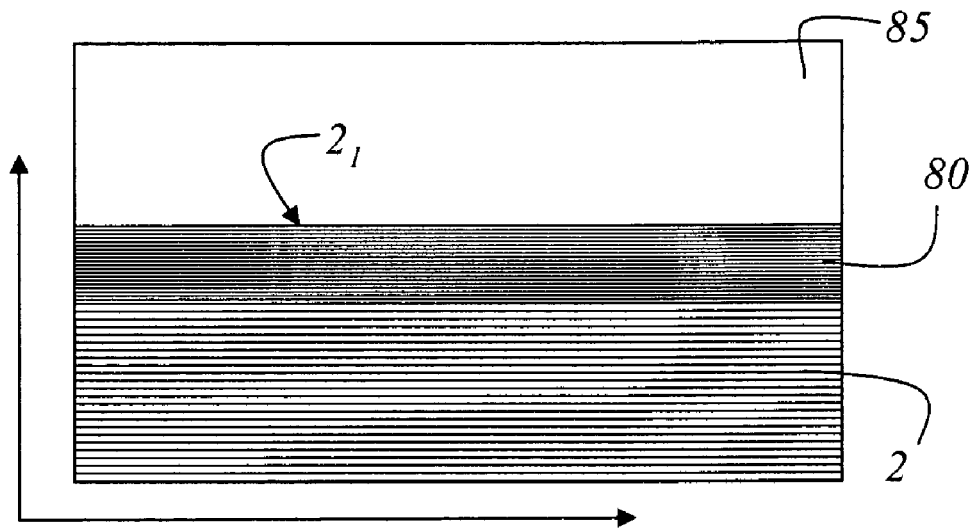
FIG. 9 shows a schematic representation of an acquired image of an edge of the mask with a measurement window representing a reference image.

FIG. 9 shows a schematic representation of capturing the edge area of the mask 2. As explained above in the description associated with FIG. 8, the upper chamfer 80 is represented as a dark or faintly exposed bar in the image of the edge area of the mask 2. Since the area of the mask 2 adjacent to the upper chamfer 80 is slightly reflective, a small amount of light is reflected by this area and therefore a small amount of light reaches the detector so that this area is also faintly exposed, but is still somewhat more exposed than the upper chamfer 80. The area beyond the mask 2 receives light from the reflective area 85 on the measurement table 20 so that this area is well exposed and thus a clear and precise separation may be determined between the outer edge $2_1$ of the mask 2. The image of the area of the outer edge $2_1$ of the mask 2 shown in FIG. 8 may be used as reference image.

Figure 10:
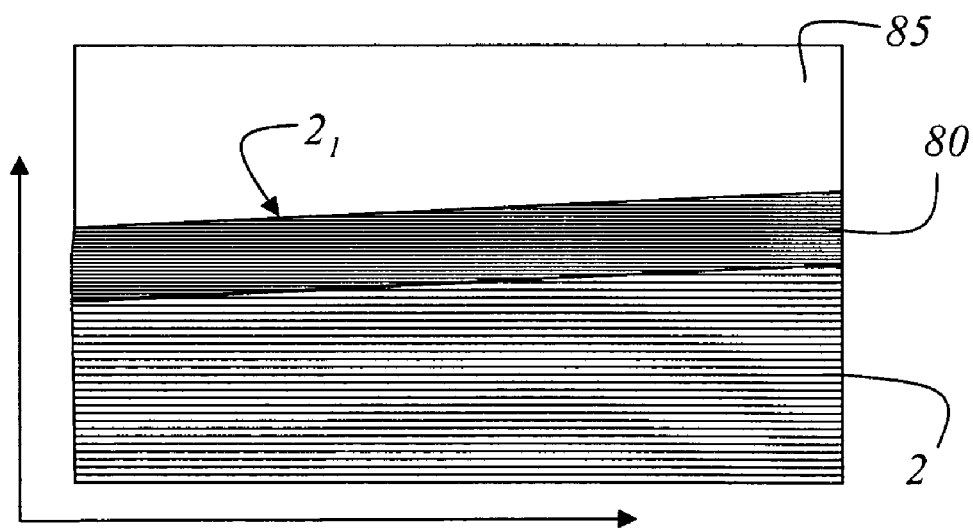
FIG. 10 shows a schematic representation of the acquired image of an outer edge with a measurement window, wherein the outer edge of the mask is not parallel to the outer edges of the measurement window.

FIG. 10 shows the acquired image of the edge area of a mask 2 using the measurement window shown in FIG. 9. It can be seen that the chamfer 80 of the mask 2 crosses the measurement window diagonally. The course of the outer edge $2_1$ of the mask 2 may now easily be determined from this image by image processing. Another way of determining the course of the outer edge $2_1$ is to change the reference image shown in FIG. 8 by rotating or shifting until the two images are congruent. The position of the outer edge $2_1$ of the mask 2 may then be determined based on the degree of shift and/or rotation.

Figure 11A:
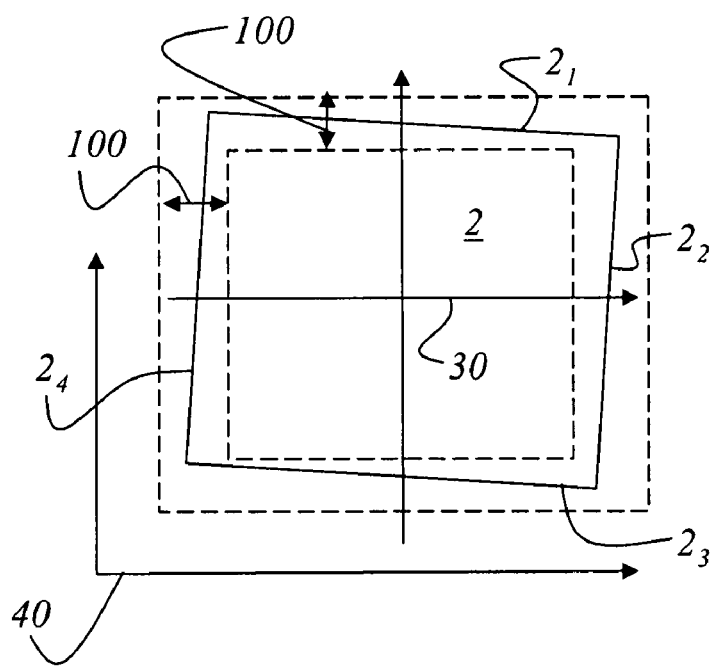
FIG. 11a shows a representation of the tolerance range within which the outer edges of the mask may range while the mask is still considered to be good.

FIG. 11a shows a representation of the tolerance range 100 within which the outer edges $2_1$, $2_2$, $2_3$ and $2_4$ of the mask 2 may range. If the outer edges $2_1$, $2_2$, $2_3$ and $2_4$ are within the tolerance range 100, the mask is considered to be good. This means that the mask may be used for wafer production. The tolerance range 100 may be defined by the user and is thus a quality criterion for a mask 2. The same effect is achieved by determining the relative position of the mask coordinate system 30 with respect to the measuring device coordinate system 40. The deviation of the positions of the two coordinate systems must not exceed a predetermined threshold.

Figure 11B:
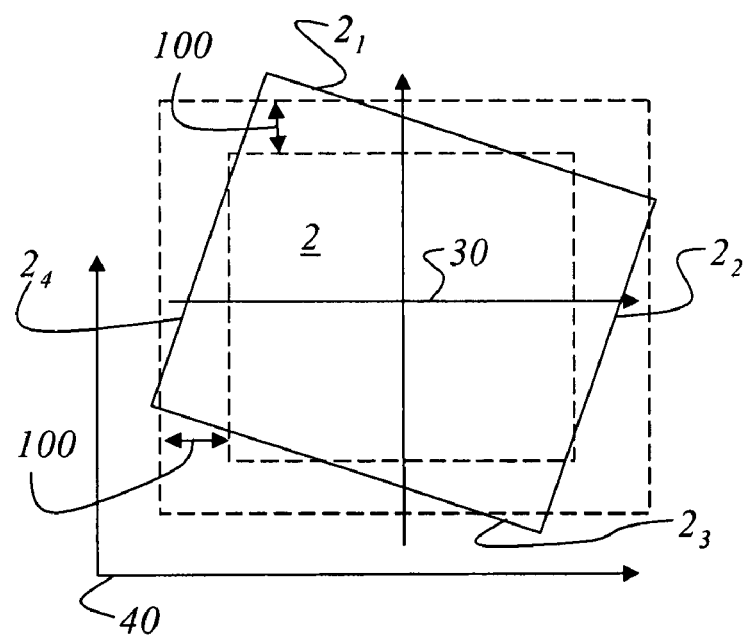
FIG. 11b shows a representation of the tolerance range, wherein the outer edges of the mask are not completely within the tolerance range so that the mask is no longer suitable for the later production of wafers.

FIG. 11b shows a representation of the tolerance range, wherein the outer edges $2_1$, $2_2$, $2_3$ and $2_4$ of the mask 2 are not completely within the tolerance range so that the mask 2 is no longer suitable for the later production of wafers. As can be seen in FIG. 11b, the outer edges $2_1$, $2_2$, $2_3$ and $2_4$ of the mask 2 protrude beyond the tolerance range marked by broken lines. Although FIGS. 11a and 11b only show a rotation of the mask 2 (or of the area on mask 2 carrying the structures), other translations, such as shifts and/or shifts and rotations, of the area of mask 2 carrying the structures are also contemplated.

The invention has been described with reference to a preferred embodiment of the invention. However, it is contemplated that modifications or changes may be made without departing from the scope of the following claims.

What is claimed is:

1. A method for determining a centrality of masks, comprising the steps of:
    positioning a mask in a coordinate measuring device on a measurement table displaceable in a direction perpendicular to an optical axis of an imaging measurement system, wherein a position of the measurement table is measured interferometrically, the coordinate measuring device defining a measuring device coordinate system;
    determining a position of at least a first and a second outer edge of the mask in the measuring device coordinate system;
    determining an angle at which the first and second outer edge meet from the position of the first and second outer edge in the measuring device coordinate system;
    determining a position of a mask coordinate system with respect to the measuring device coordinate system based on at least two structures on the mask;
    determining a relative distance from one of the at least first and second outer edges to the at least two structures, and determining by the coordinate measuring device the coordinates of the at least two structures with respect to the first and second edge and determining whether the first and second edges are within a tolerance range.

2. The method of claim 1, wherein the at least two structures includes two structures and the position of the first and second edge is determined based on the positions of the two structures, wherein the two structures are not located on any line parallel to one of the first and second edge, and that the distances from the two structures to the first and second edges are determined in an X-coordinate direction and in a Y-coordinate direction.

3. The method of claim 1, wherein the at least two structures includes three structures and the position of the first and second edge is determined based on the positions of the three structures, wherein the three structures must not be located on any line parallel to one of the first and second edge, and that the distances from the three structures to the first and second edges are determined in an X-coordinate direction and in a Y-coordinate direction.

4. The method of claim 1, wherein the at least two structures includes four structures and the position of the first and second edge is determined based on the positions of the four structures, wherein always two of the four structures are located on different lines, and that the distances from the four structures to the first and second edges are determined in an X-coordinate direction and in a Y-coordinate direction.

5. The method of claim 1, wherein the determination of the position of the first and second outer edge is performed with imaging optics.

6. The method of claim 1, wherein, at least in an area below the outer edges of the mask positioned thereon, a surface of the measurement table is provided with a reflective agent designed to reflect imaging beams of the coordinate measuring device.

7. The method of claim 1, wherein an angle at which the first and second outer edges intersect may be determined based on the position of the first and second outer edges.

8. The method of claim 1, wherein positions of all four outer edges of the mask are determined, wherein a length of the edge to be measured is determined if the positions of the four outer edges are known.

9. The method of claim 1, wherein, based on stored coordinate positions of the structures on the mask, positions of the outer edges and an angular position of the intersecting outer edges, evaluations are performed.

10. The method of claim 1, wherein the position of each of the first and the second edge is determined using at least one measurement window, a camera arranged in the imaging measurement system and by subsequent image processing.

11. The method of claim 9, wherein the evaluations includes at least one of determination of center of gravity shifts, rotations or orthogonality of a structural pattern relative to the mask coordinate system, determination of positions of structures on the mask relative to the outer edges of the mask, and determination of a deviation of the mask from rectangularity.

12. The method of claim 10, wherein the at least one measurement window is positioned such that the respective first and second edge of the mask is located in the at least one measurement window.

13. The method of claim 10, wherein the positions of the at least two structures is determined by image evaluation of data of the at least two structures acquired with the at least one measurement window.

14. The method of claim 10, wherein at least one reference image of at least one of the first outer edge and second outer edge is stored in the coordinate measuring device, and a position of the at least one of the first outer edge and second outer edge to be measured is determined such that the stored reference image of the least one of the first outer edge and second outer edge is matched with an image of the at least one of the first outer edge and second outer edge acquired with the at least one measurement window of the camera by rotating and/or shifting, wherein the position of the at least one of the first outer edge and second outer edge results from an amount of rotating and/or shifting of the reference image with respect to the mask coordinate system.

* * * * *